(12) United States Patent
Lee

(10) Patent No.: US 7,715,252 B2
(45) Date of Patent: May 11, 2010

(54) SYNCHRONOUS SEMICONDUCTOR MEMORY DEVICE AND METHOD FOR DRIVING THE SAME

(75) Inventor: Kang-Youl Lee, Kyoungki-do (KR)

(73) Assignee: Hynix Semiconductor, Inc., Gyeonggi-do (KR)

( * ) Notice: Subject to any disclaimer, the term of this patent is extended or adjusted under 35 U.S.C. 154(b) by 121 days.

(21) Appl. No.: 12/164,637

(22) Filed: Jun. 30, 2008

(65) Prior Publication Data

US 2009/0086557 A1 Apr. 2, 2009

(30) Foreign Application Priority Data

Sep. 28, 2007 (KR) ...................... 10-2007-0098224
Apr. 30, 2008 (KR) ...................... 10-2008-0040929

(51) Int. Cl.
*G11C 7/00* (2006.01)
(52) U.S. Cl. ..................... 365/193; 365/191; 365/233.1; 365/233.14; 365/233.13; 365/233.18; 365/189.05; 365/154; 714/700; 713/400
(58) Field of Classification Search ................. 365/193, 365/191, 233.1, 233.14, 233.13, 233.18, 365/189.05, 154; 714/700; 713/400
See application file for complete search history.

(56) References Cited

U.S. PATENT DOCUMENTS

2006/0164909 A1* 7/2006 Gower et al. ................. 365/193
2007/0291557 A1* 12/2007 Nishio et al. ................. 365/193
2008/0101138 A1* 5/2008 Jo ............................... 365/193

FOREIGN PATENT DOCUMENTS

| JP | 2000-156083 | 6/2000 |
| KR | 1020040093858 A | 11/2004 |
| KR | 1020050001912 A | 1/2005 |
| KR | 1020050011984 A | 1/2005 |

OTHER PUBLICATIONS

Notice of Allowance issued from Korean Intellectual Property Office on Oct. 30, 2009.

* cited by examiner

*Primary Examiner*—Anh Phung
*Assistant Examiner*—Eric Wendler
(74) *Attorney, Agent, or Firm*—IP & T Law Firm PLC

(57) ABSTRACT

A synchronous semiconductor memory device including a data alignment reference pulse generating unit configured to generate a data alignment reference pulse in response to a data strobe signal (DQS), an alignment hold signal generating unit configured to generate an alignment hold signal, which is activated during a period corresponding to a postamble of the data strobe signal, in response to the data alignment reference pulse and a data input clock, and a data alignment unit configured to align input data in response to the data alignment reference pulse and the alignment hold signal.

11 Claims, 5 Drawing Sheets

SYNCHRONOUS SEMICONDUCTOR MEMORY DEVICE AND METHOD FOR DRIVING THE SAME

CROSS-REFERENCES TO RELATED APPLICATIONS

This application claims priority of Korean patent application number Nos. 10-2007-0098224 and 10-2008-0040929, filed on Sep. 28, 2007, and Apr. 30, 2008, respectively, which are incorporated by reference in their entireties.

BACKGROUND OF THE INVENTION

The subject matter relates to a semiconductor design technology, and more particularly, to a write path of a synchronous semiconductor memory device.

Semiconductor memory devices, such as a dynamic random access memory (DRAM), receive write data from a chipset (a memory controller), and transfer read data to the chipset. Meanwhile, synchronous semiconductor memory devices operate in synchronization with a system clock. However, when transferring data from the chipset to the memory device, skew occurs between data and a system clock due to different loading and traces for data and the system clock and location differences between the system clock and a plurality of memory devices.

In order to reduce the skew between the data and the system clock, a data strobe signal (DQS) is transferred together with data when transferring the data from the chipset to the memory device. The data strobe signal (DQS) is also called an echo clock. By strobing the data using the data strobe signal (DQS), skew occurring due to the location difference between the system clock and the memory devices can be reduced because the data strobe signal (DQS) has the same loading and trace as the data. Meanwhile, in a read operation, the memory device transfers a read data strobe signal (DQS) to the chipset together with the data.

FIG. 1 is a circuit diagram illustrating a write path of a conventional synchronous semiconductor memory device.

Referring to FIG. 1, on the write path, the conventional synchronous semiconductor memory device includes a DQS input buffer unit 110, a data strobe falling pulse (DSFP) generating unit 120, a DQS buffer disable signal generating unit 130, a data alignment unit 140, and a global data line (GDL) write driving unit 150. The DQS input buffer unit 110 buffers a data strobe signal DQS in response to a DQS buffer disable signal DISABLE_DQS. The DSFP generating unit 120 receives an output signal of the DQS input buffer unit 110 to generate a data strobe falling pulse DSFP in synchronization with a falling edge of the data strobe signal DQS. The DQS buffer disable signal generating unit 130 generates the DQS buffer disable signal DISABLE_DQS in response to the data strobe falling pulse DSFP, a data strobe disable signal DIS_DSP, and a write pulse WTPb. The data strobe disable signal DIS_DSP is a signal that is pulsed to a logic high level after a time corresponding to a burst length (BL) elapses from the input of a write command, and the write pulse WTPb is a signal that is pulsed to a logic low level when a write command is input. The data alignment unit 140 aligns input data DIN in response to the data strobe falling pulse DSFP. The input data DIN are data output from a data input buffer (not shown). The GDL write driving unit 150 transfers the aligned data ALGN_R0, ALGN_R1, ALGN_F0 and ALGN_F1 output from the data alignment unit 140 through global data lines GDL_Q0, GDL_Q1, GDL_Q2 and GDL_Q3 in synchronization with a data input clock DINCLK. The data input clock DINCLK is a signal that is pulsed to a logic high level after a predetermined time considering a write latency (WL) elapses from the input of the write command.

The DQS buffer disable signal generating unit 130 includes an AND gate AND1, a pull-up PMOS transistor MP1, a pull-down NMOS transistor MN1, and a latch INV1 and INV2. The AND gate AND1 performs an AND operation on the data strobe falling pulse DSFP and the data strobe disable signal DIS_DSP. The pull-up PMOS transistor MP1 has a source connected to a power supply voltage terminal VDD, a drain connected to a DISABLE_DQS output terminal N1, and a gate receiving the write pulse WTPb. The pull-down NMOS transistor MN1 has a source connected to a ground voltage terminal VSS, a drain connected to the DISABLE_DQS output terminal N1, and a gate receiving an output signal of the AND gate AND1. The latch INV1 and INV2 latches a signal applied to the DISABLE_DQS output terminal N1.

The data alignment unit 140 includes an inverter INV3, a D flip-flop 142, a D flip-flop 144, a D flip-flop 146, and a D flip-flop 148. The inverter INV3 inverts the data strobe falling pulse DSFP, and the D flip-flop 142 transfers the input data DIN in response to a falling edge of an output signal of the inverter INV3. The D flip-flop 144 transfers the aligned data ALGN_R1 output from the D flip-flop 142 in response to the falling edge of the output signal of the inverter INV3. The D flip-flop 146 transfers the input data DIN in response to the falling edge of the output signal of the inverter INV3. The D flip-flop 148 transfers the aligned data ALGN_F1 output from the D flip-flop 146 in response to the falling edge of the output signal of the inverter INV3.

The GDL write driving unit 150 includes GDL write drivers 152, 154, 156 and 158. The GDL write driver 152 transfers the aligned data ALGN_R0 output from the D flip-flop 144 to the global data line GDL_Q0 in synchronization with the data input clock DINCLK. The GDL write driver 154 transfers the aligned data ALGN_R1 output from the D flip-flop 142 to the global data line GDL_Q1 in synchronization with the data input clock DINCLK. The GDL write driver 156 transfers the aligned data ALGN_F0 output from the D flip-flop 148 to the global data line GDL_Q2 in synchronization with the data input clock DINCLK. The GDL write driver 158 transfers the aligned data ALGN_F1 output from the D flip-flop 146 to the global data line GDL_Q3 in synchronization with the data input clock DINCLK.

FIG. 2 is a timing diagram of the conventional synchronous semiconductor memory device of FIG. 1.

Referring to FIG. 2, when the write command is input, the memory device receives the data DQ together with the data strobe signal DQS. In FIG. 2, a burst write command is input (BL=4) and a reference symbol "INT_WT" represents an internal write command signal.

The DSFP generating unit 120 generates the data strobe falling pulse DSFP that is activated to a logic high level at each falling edge of the data strobe signal DQS, and the data alignment unit 140 outputs the aligned data ALGN_R0, ALGN_R1, ALGN_F0 and ALGN_F1 in synchronization with rising edges of the data strobe signal DSFP.

When the input of the data DQ is completed and thus both the data strobe falling pulse DSFP and the data strobe disable signal DIS_DSP become a logic high level, the DQS buffer disable signal generating unit 130 changes the DQS buffer disable signal DISABLE_DQS to a logic low level. Thus, the DQS input buffer unit 110 is disabled so that it does not receive the data strobe signal DQS any more.

The GDL write drivers 152, 154, 156 and 158 transfer the aligned data ALGN_R0, ALGN_R1, ALGN_F0 and ALGN_F1 to the global data lines GDL_Q0, GDL_Q1, GDL_Q2 and GDL_Q3 in synchronization with the data input clock DINCLK.

However, when the toggling data strobe signal DQS returns to a high impedance (Hi-Z) after the last falling edge, one-time ringing often occurs. This phenomenon is called a write postamble ringing.

FIG. 3 is a timing diagram of the synchronous semiconductor memory device of FIG. 1 when a write postamble ringing occurs.

It can be seen from FIG. 3 that the ringing occurs when the toggling data strobe signal DQS returns to the high impedance (Hi-Z).

If the ringing occurs before the DQS buffer enable signal DISABLE_DQS changes to a logic low level, the DSFP generating unit 120 recognizes it as the falling edge of the data strobe signal DQS, so that glitch is generated at the data strobe falling pulse DSFP.

Due to the glitch, the values of the aligned data ALGN_R0, ALGN_R1, ALGN_F0 and ALGN_F1 are early changed. Therefore, incorrect data are input at the rising edges of the data input clock DINCLK, and undesired data are loaded on the global data lines GDL_Q0, GDL_Q1, GDL_R2 and GDL_Q3.

Such problems may occur when the write command is independently applied, as well as when the write command is successively input.

SUMMARY OF THE INVENTION

Embodiments of the present invention are directed to providing a synchronous semiconductor memory device, which is capable of preventing data error caused by a write postamble ringing of a data strobe signal (DQS), and a method for driving the same.

In accordance with an aspect of the present invention, there is provided a synchronous semiconductor memory device, including: a data alignment reference pulse generating unit configured to generate a data alignment reference pulse in response to a data strobe signal (DQS); an alignment hold signal generating unit configured to generate an alignment hold signal, which is activated during a period corresponding to a postamble of the data strobe signal, in response to the data alignment reference pulse and a data input clock; and a data alignment unit configured to align input data in response to the data alignment reference pulse and the alignment hold signal.

In accordance with another aspect of the present invention, there is provided a synchronous semiconductor memory device, including: a data strobe signal input buffer unit configured to buffer a data strobe signal; a data strobe falling pulse generating unit configured to receive an output signal of the data strobe signal input buffer unit to generate a data strobe falling pulse in synchronization with a falling edge of the data strobe signal; a data alignment unit configured to align input data in response to the data strobe falling pulse and an alignment hold signal; a global data line write driving unit configured to transfer the aligned data output from the data alignment unit through global data lines in synchronization with a data input clock; and an alignment hold signal generating unit configured to generate the alignment hold signal, which is activated during a period corresponding to a postamble of the data strobe signal, in response to the data strobe falling pulse and the data input clock.

A synchronous semiconductor memory device in accordance with the embodiment of the present invention further generates the alignment hold signal that is set by the last data strobe falling pulse (DSFP) corresponding to the write command and is reset by the data input clock (DINCLK) corresponding to the write command. The alignment hold signal masks the application of the data strobe falling pulse (DSFP) to the data alignment unit during a period when a glitch is generated.

DETAILED DESCRIPTION

Hereinafter, a synchronous semiconductor memory device and a method for driving the same in accordance with exemplary embodiments of the present invention will be described in detail with reference to the accompanying drawings.

A synchronous semiconductor memory device in accordance with an embodiment of the present invention includes a data alignment reference pulse generating unit configured to generate a data strobe falling pulse (DSFP), which serves as a data alignment reference pulse, in response to a data strobe signal (DQS), an alignment hold signal generating unit configured to generate an alignment hold signal (ALGN_HOLD), which is activated during a predetermined period corresponding to a postamble of the data strobe signal (DQS), in response to the data strobe falling pulse (DSFP) and a data input clock (DINCLK), and a data alignment unit configured to align input data (DIN) in response to the data strobe falling pulse (DSFP) and the alignment hold signal (ALGN_HOLD).

In addition, the synchronous semiconductor memory device further includes a global data line write driving unit configured to transfer aligned data output from the data alignment unit to global data lines in response to the data input clock (DINCLK).

Figure 1:
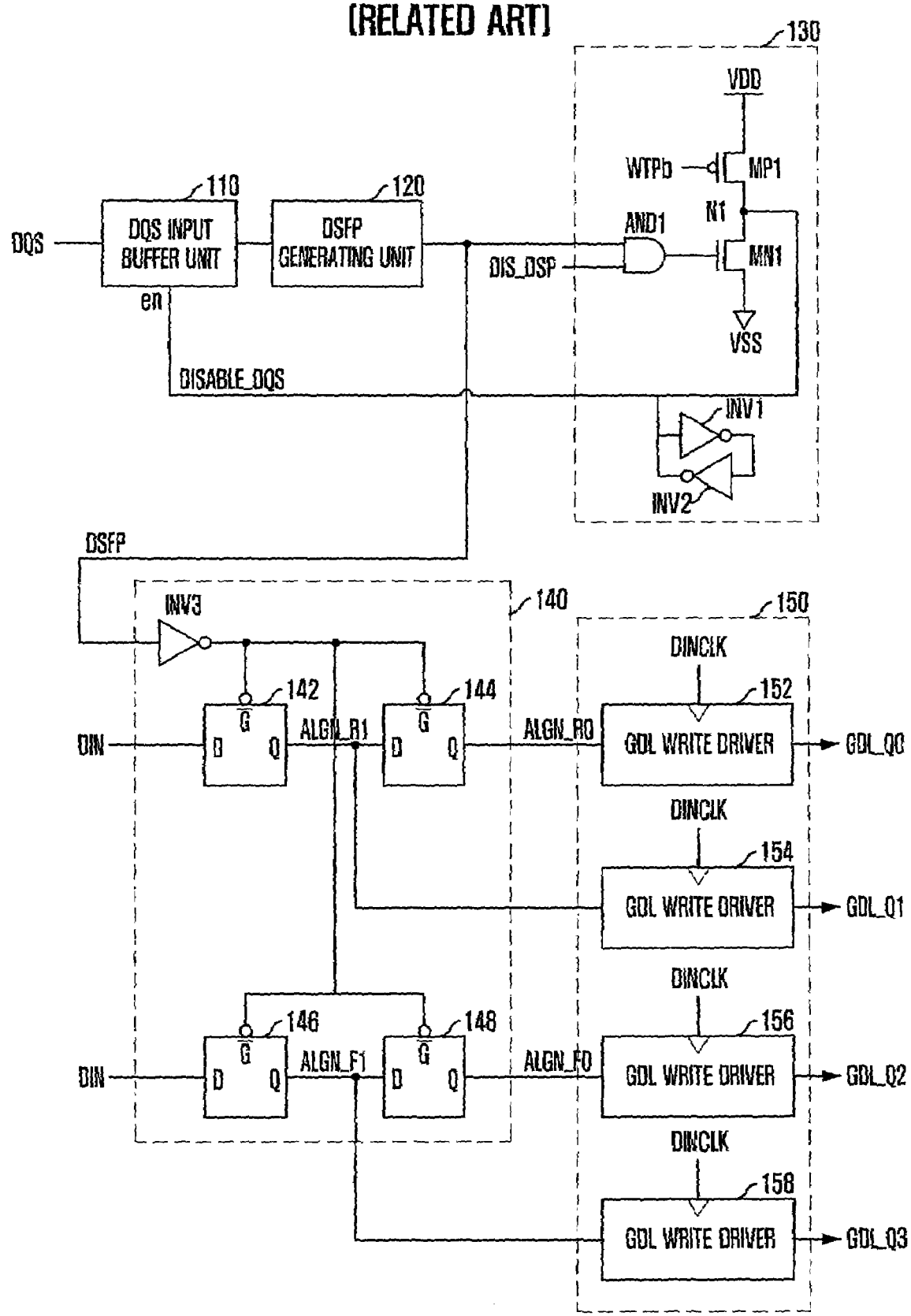
FIG. 1 is a circuit diagram illustrating a write path of a conventional synchronous semiconductor memory device.
Figure 2:
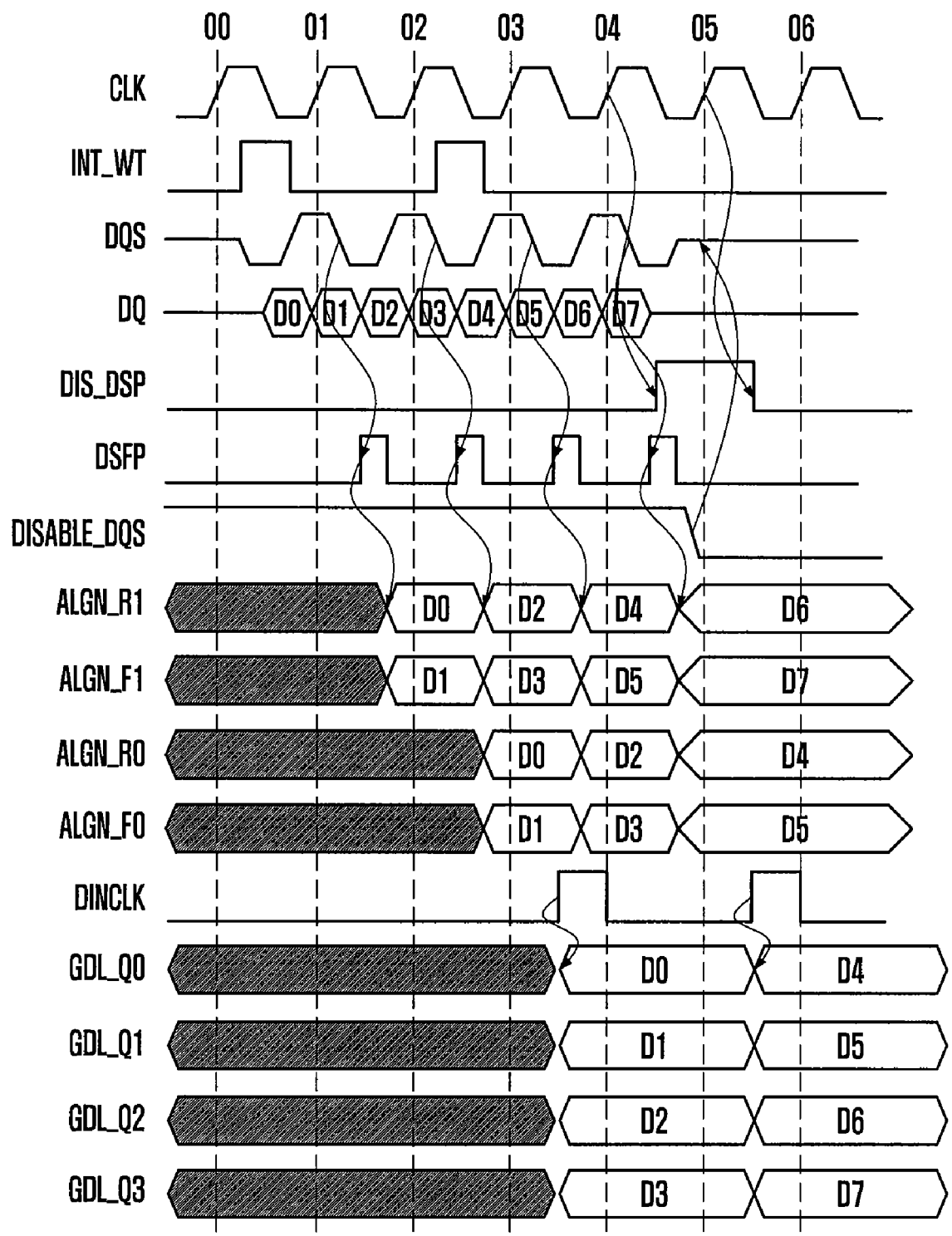
FIG. 2 is a timing diagram of the conventional synchronous semiconductor memory device of FIG. 1.
Figure 3:
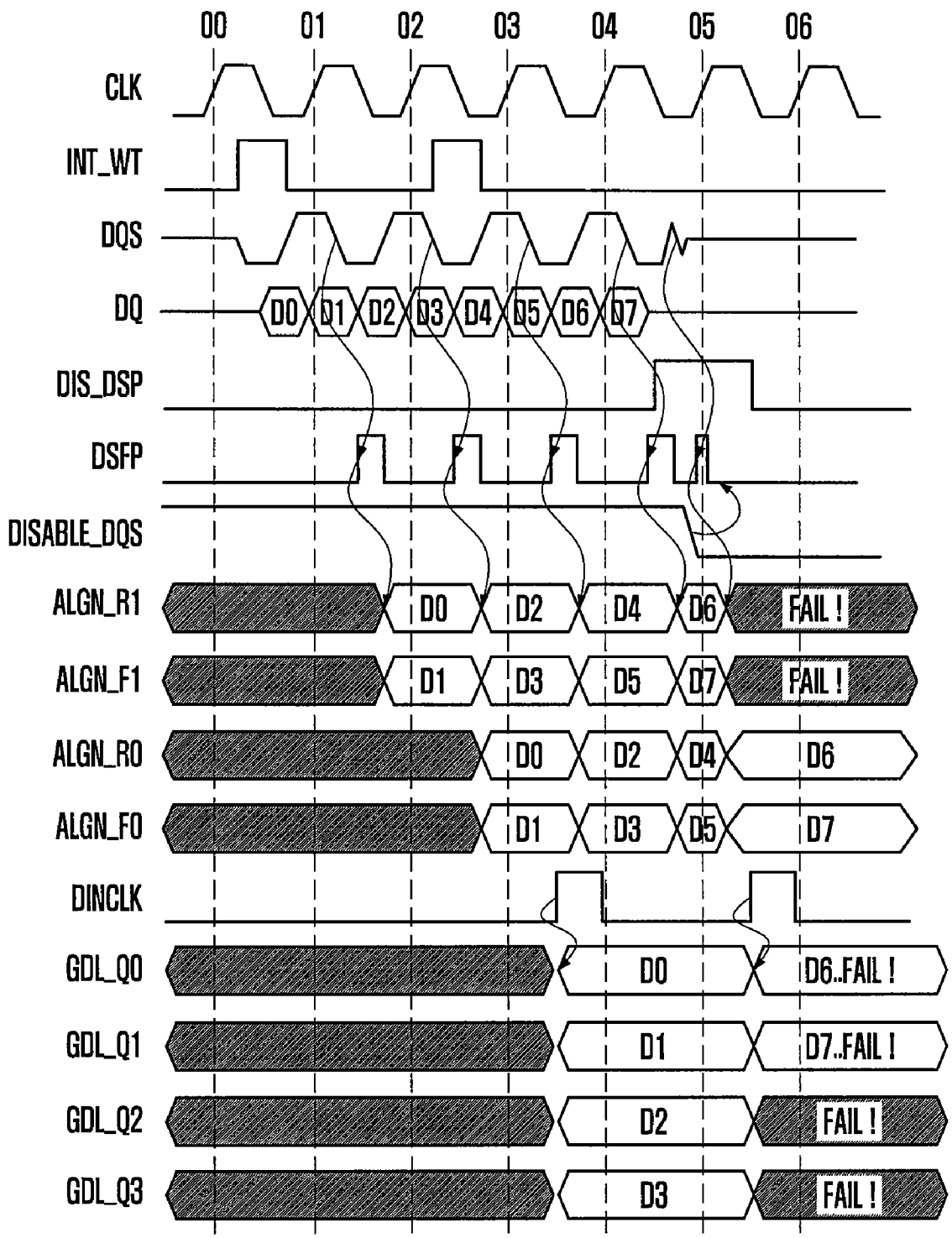
FIG. 3 is a timing diagram of the synchronous semiconductor memory device of FIG. 1 when a write postamble ringing occurs.
Figure 4:
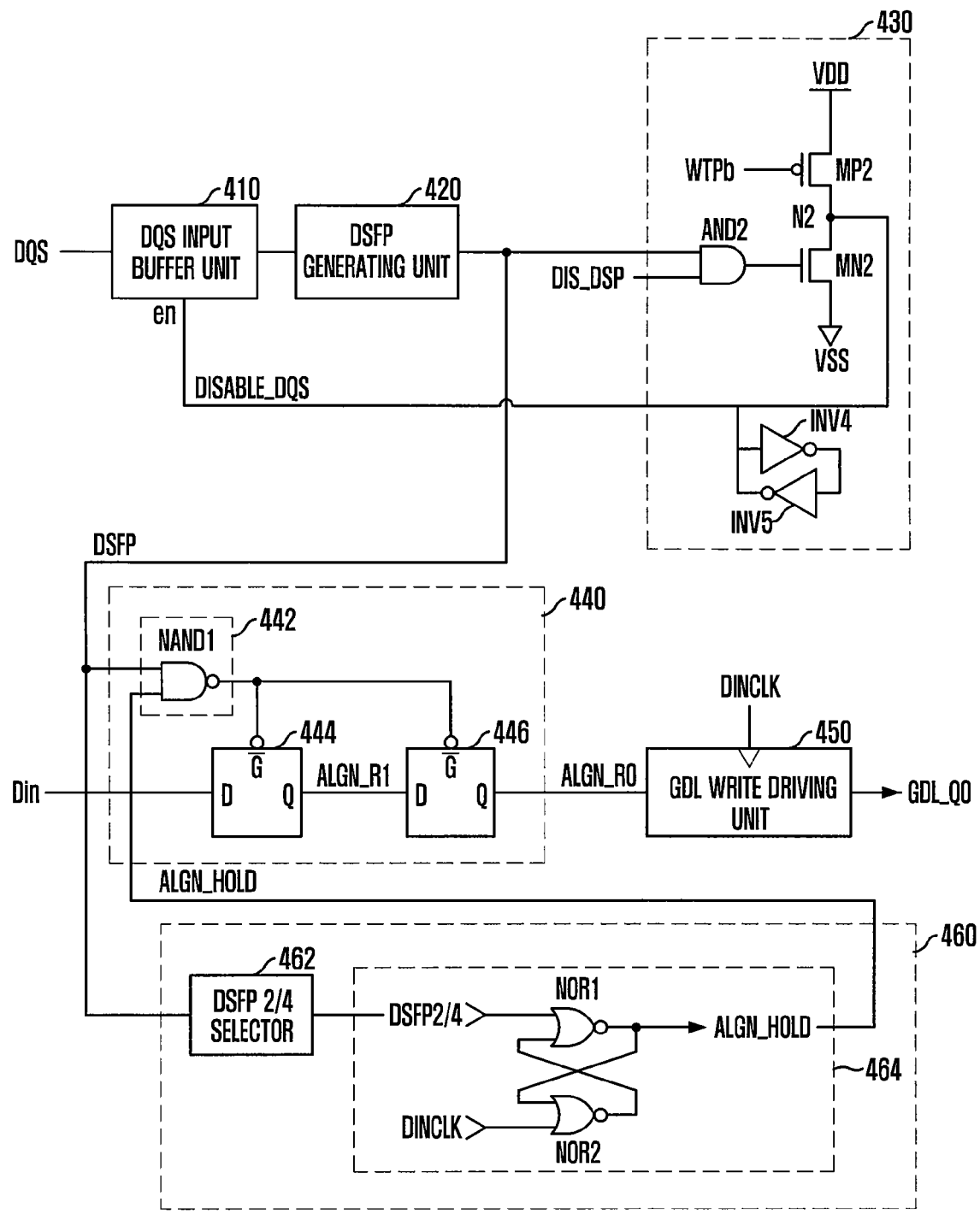
FIG. 4 is a circuit diagram illustrating a write path of a synchronous semiconductor memory device in accordance with an embodiment of the present invention.

FIG. 4 is a circuit diagram illustrating a write path of a synchronous semiconductor memory device in accordance with an embodiment of the present invention.

Referring to FIG. 4, on the write path, the synchronous semiconductor memory device includes a DQS input buffer unit 410, a data strobe falling pulse (DSFP) generating unit 420, a DQS buffer disable signal generating unit 430, a data alignment unit 440, a GDL write driving unit 450, and an alignment hold signal generating unit 460. The DQS input buffer unit 410 buffers a data strobe signal DQS in response to a DQS buffer disable signal DISABLE_DQS. The DSFP generating unit 420 receives an output signal of the DQS input buffer unit 410 to generate a data strobe falling pulse DSFP in synchronization with a falling edge of the data strobe signal DQS. The DQS buffer disable signal generating unit 430 generates the DQS buffer disable signal DISABLE_DQS in response to the data strobe falling pulse DSFP, a data strobe disable signal DIS_DSP, and a write pulse WTPb. The data alignment unit 440 aligns input data DIN in response to the data strobe falling pulse DSFP and the alignment hold signal ALGN_HOLD. The GDL write driving unit 450 transfers the aligned data ALGN_R0, ALGN_R1, ALGN_F0 and ALGN_F1 output from the data alignment unit 440 through global data lines GDL_Q0, GDL_Q1, GDL_Q2 and GDL_Q3 in synchronization with a data input clock DIN-CLK. The alignment hold signal generating unit 460 generates the alignment hold signal ALGN_HOLD, which is activated during a predetermined period corresponding to the postamble of the data strobe signal DQS, in response to the data strobe falling pulse DSFP and the data input clock DIN-CLK.

The DQS buffer disable signal generating unit 430 includes an AND gate AND2, a pull-up PMOS transistor MP2, a pull-down NMOS transistor MN2, and a latch INV4 and INV5. The AND gate AND2 performs an AND operation on the data strobe falling pulse DSFP and the data strobe disable signal DIS_DSP. The pull-up PMOS transistor MP2 has a source connected to a power supply voltage terminal VDD, a drain connected to a DISABLE_DQS output terminal N2, and a gate receiving the write pulse WTPb. The pull-down NMOS transistor MN2 has a source connected to a ground voltage terminal VSS, a drain connected to the DISABLE_DQS output terminal N2, and a gate receiving an output signal of the AND gate AND2. The latch INV1 and INV2 latches a signal applied to the DISABLE_DQS output terminal N2.

The data alignment unit 440 includes a blocking unit 442, a D flip-flop 444, and a D flip-flop 446. The blocking unit 442 selectively blocks the data strobe falling pulse DSFP according to the alignment hold signal ALGN_HOLD. The D flip-flop 444 transfers the input data DIN in response to a falling edge of an output signal of the blocking unit 442. The D flip-flop 446 transfers the aligned data ALGN_R1 output from the D flip-flop 444 in response to the falling edge of the output signal of the blocking unit 442. The blocking unit 442 may be implemented with a NAND gate NAND1 receiving the data strobe falling pulse DSFP and the alignment hold signal ALGN_HOLD.

For the sake of simplicity, only the D flip-flops 444 and 446 for generating the aligned data ALGN_R1 and ALGN_R0 and the GDL write driver 450 for the global data line GDL_Q0 are illustrated in FIG. 4. However, another GDL write driver is used to transfer the aligned data ALGN_R1 to the global data line GDL_Q1, but is not illustrated. In addition, the D flip-flops for generating the aligned data ALGN_F1 and ALGN_F0 and the GDL write drivers for the aligned data ALGN_F1 and ALGN_F0 are also used but not illustrated.

The alignment hold signal generating unit 460 includes a DSFP 2/4 selector 462 and an RS latch 464. The DSFP 2/4 selector 462 samples second and fourth pulses of the data strobe falling pulse DSFP, and the RS latch 464 receives output signal DSFP2/4 of the DSFP 2/4 selector 462 as a set input, and receives the data input clock DINCLK as a reset input. The RS latch 464 may be implemented with cross-coupled NOR gates NOR1 and NOR2.

Figure 5:
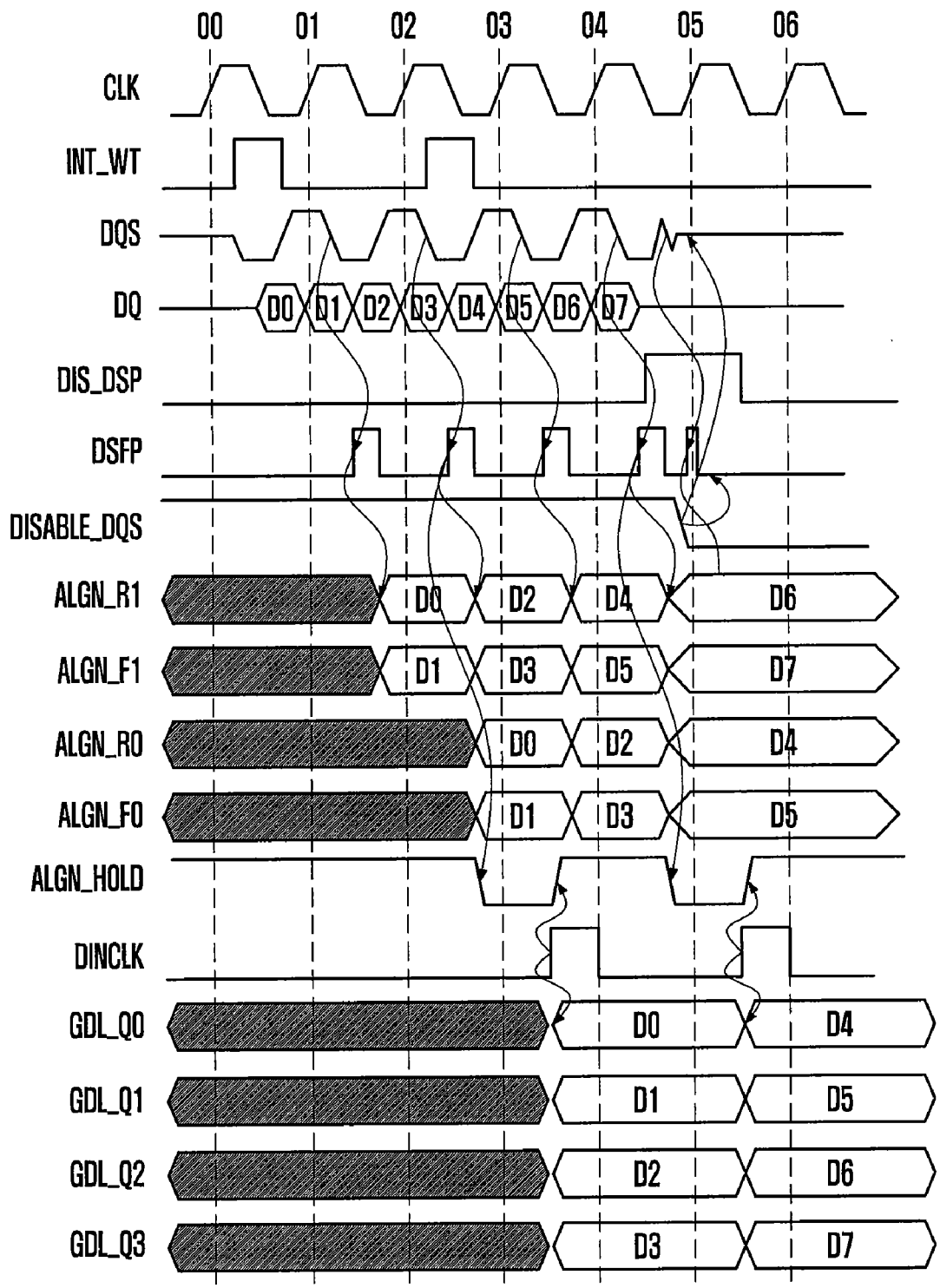
FIG. 5 is a timing diagram of the synchronous semiconductor memory device of FIG. 4.

FIG. 5 is a timing diagram of the synchronous semiconductor memory device of FIG. 4.

Referring to FIG. 5, when the write command is input, the memory device receives the data DQ together with the data strobe signal DQS. In FIG. 5, a burst write command is input (BL=4) and a reference symbol "INT_WT" represents an internal write command signal.

The DSFP generating unit 420 generates the data strobe falling pulse DSFP that is activated to a logic high level at each falling edge of the data strobe signal DQS.

The alignment hold signal generating unit 460 outputs the alignment hold signal ALGN_HOLD that is set at the rising edges of the second and fourth pulses of the data strobe falling pulse DSFP and is reset at the rising edge of the data input clock DINCLK.

Meanwhile, the data alignment unit 440 outputs the aligned data ALGN_R0, ALGN_R1, ALGN_F0 and ALGN_F1 in synchronization with the rising edges of the data strobe falling pulse DSFP. In this case, during a period where the alignment hold signal ALGN_HOLD is at a logic low level, the data strobe falling pulse DSFP is masked, so that the aligned data are maintained while a new alignment operation is not performed during that period.

When the input of the data DQ is completed and thus both the data strobe falling pulse DSFP and the data strobe disable signal DIS_DSP become a logic high level, the DQS buffer disable signal generating unit 430 changes the DQS buffer disable signal DISABLE_DQS to a logic low level. Thus, the DQS input buffer unit 410 is disabled so that it does not receive the data strobe signal DQS any more.

The GDL write drivers transfer the aligned data ALGN_R0, ALGN_R1, ALGN_F0 and ALGN_F1 to the global data lines GDL_Q0, GDL_Q1, GDL_Q2 and GDL_Q3 in synchronization with the data input clock DINCLK.

Therefore, even though the write postamble ringing occurs and glitch is generated in the data strobe falling pulse DSFP, the alignment hold signal ALGN_HOLD is maintained at a logic low level during the period where the glitch is generated. Consequently, since the data strobe falling pulse DSFP is blocked, the illegal data alignment caused by the glitch can be prevented. That is, the data error caused by the write postamble ringing can be prevented.

As described above, even though the write postamble ringing of the data strobe signal DQS occurs, the malfunction of the write path can be prevented by blocking the illegal transfer operation of the aligned data.

Although it has been described in the above-described embodiments that eight data are input (BL=4) without gap by the burst write command, the present invention can also be applied to any case where the single write command is input or the ringing occurs in the postamble of the data strobe signal DQS.

Furthermore, although it has been described in the above-described embodiments that the alignment hold signal generating unit passes the second and fourth pulses of the data strobe falling pulse DSFP while bypassing the first and third pulses of the data strobe falling pulse DSFP, the sampling scheme needs to be modified if the burst length (BL) is changed.

While the present invention has been described with respect to the specific embodiments, it will be apparent to those skilled in the art that various changes and modifications may be made without departing from the spirit and scope of the invention as defined in the following claims.

What is claimed is:

1. A synchronous semiconductor memory device, comprising:
   a data alignment reference pulse generating unit configured to generate a data alignment reference pulse in response to a data strobe signal (DQS);
   an alignment hold signal generating unit configured to generate an alignment hold signal, which is activated during a period corresponding to a postamble of the data strobe signal, in response to the data alignment reference pulse and a data input clock; and a data alignment unit configured to align input data in response to the data alignment reference pulse and the alignment hold signal.

2. The synchronous semiconductor memory device as recited in claim 1, further comprising a global data line write driving unit configured to transfer aligned data output from the data alignment unit to global data lines in response to the data input clock.

3. The synchronous semiconductor memory device as recited in claim 1, wherein the alignment hold signal generating unit comprises:
- a pulse selector configured to sample specific activation periods of the data alignment reference pulse corresponding to the postamble of the data strobe signal; and
- an RS latch configured to receive output signals of the pulse selector as a set input, receive the data input clock as a reset input, and output the alignment hold signal.

4. A synchronous semiconductor memory device, comprising:
- a data strobe signal input buffer unit configured to buffer a data strobe signal;
- a data strobe falling pulse generating unit configured to receive an output signal of the data strobe signal input buffer unit to generate a data strobe falling pulse in synchronization with a falling edge of the data strobe signal;
- a data alignment unit configured to align input data in response to the data strobe falling pulse and an alignment hold signal;
- a global data line write driving unit configured to transfer the aligned data output from the data alignment unit through global data lines in synchronization with a data input clock; and
- an alignment hold signal generating unit configured to generate the alignment hold signal, which is activated during a period corresponding to a postamble of the data strobe signal, in response to the data strobe falling pulse and the data input clock.

5. The synchronous semiconductor memory device as recited in claim 4, wherein the alignment hold signal generating unit comprises:
- a pulse selector configured to sample specific activation periods of the data strobe falling pulse corresponding to the postamble of the data strobe signal; and
- an RS latch configured to receive an output signal of the pulse selector as a set input and receive the data input clock as a reset input.

6. The synchronous semiconductor memory device as recited in claim 4, wherein the data alignment unit comprises:
- a blocking unit configured to selectively block the data strobe falling pulse according to the alignment hold signal; and
- a plurality of D flip-flops configured to transfer the input data in response to an output signal of the blocking unit.

7. The synchronous semiconductor memory device as recited in claim 4, further comprising a buffer disable signal generating unit configured to generate a buffer disable signal for disabling the data strobe signal input buffer in response to the data strobe falling pulse, a data strobe disable signal, and a write pulse.

8. The synchronous semiconductor memory device as recited in claim 5, wherein the pulse selector samples second and fourth data strobe falling pulses generated by the data strobe falling pulse generating unit.

9. The synchronous semiconductor memory device as recited in claim 5, wherein the RS latch includes cross-coupled first and second NOR gates respectively receiving the output signal of the pulse selector and the data input clock.

10. The synchronous semiconductor memory device as recited in claim 6, wherein the blocking unit comprises a NAND gate configured to receive the data strobe falling pulse and the alignment hold signal.

11. The synchronous semiconductor memory device as recited in claim 7, wherein the buffer disable signal generating unit comprises:
- an AND gate configured to perform an AND operation on the data strobe falling pulse and the data strobe disable signal;
- a pull-up PMOS transistor having a source connected to a power supply voltage terminal, a drain connected to a buffer disable signal output terminal, and a gate receiving the write pulse;
- a pull-down NMOS transistor having a source connected to a ground voltage terminal, a drain connected to the buffer disable signal output terminal, and a gate receiving an output signal of the AND gate; and
- a latch configured to latch a signal applied to the buffer disable signal output terminal.

* * * * *